United States Patent
Hauf et al.

(10) Patent No.: US 9,581,912 B2
(45) Date of Patent: Feb. 28, 2017

(54) MODEL-BASED CONTROL OF AN OPTICAL IMAGING DEVICE

(71) Applicant: Carl Zeiss SMT GmbH, Oberkochen (DE)

(72) Inventors: Markus Hauf, Ulm (DE); Gerald Rothenhoefer, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/812,008

(22) Filed: Jul. 29, 2015

(65) Prior Publication Data

US 2016/0026093 A1    Jan. 28, 2016

Related U.S. Application Data

(63) Continuation of application No. PCT/EP2014/053955, filed on Feb. 28, 2014.

(30) Foreign Application Priority Data

Feb. 28, 2013  (DE) .................. 10 2013 203 338

(51) Int. Cl.
  *G03B 27/52* (2006.01)
  *G03B 27/42* (2006.01)
  (Continued)

(52) U.S. Cl.
  CPC ......... *G03F 7/70308* (2013.01); *G02B 7/008* (2013.01); *G02B 7/028* (2013.01); *G03F 7/705* (2013.01); *G03F 7/70891* (2013.01)

(58) Field of Classification Search
  CPC .............................. G03F 7/705; G03F 7/70308
  (Continued)

(56) References Cited

U.S. PATENT DOCUMENTS

2003/0111458 A1* 6/2003 Wakui ................. G03F 7/70858
                                                                  219/494
2009/0135385 A1   5/2009 Gellrich et al.
2013/0230073 A1* 9/2013 Vogt ....................... G01K 11/00
                                                                  374/45

FOREIGN PATENT DOCUMENTS

EP    1 477 853 A2    11/2004
EP    1 513 021 A1     3/2005
                (Continued)

OTHER PUBLICATIONS

German Office Action, with English translation thereof, for DE Appl No. 10 2013 203 338.9, dated Oct. 30, 2015.

(Continued)

*Primary Examiner* — Hung Henry Nguyen
(74) *Attorney, Agent, or Firm* — Fish & Richardson P.C.

(57) ABSTRACT

The disclosure provides a method of determining an actual input value of an input variable for a control unit of a microlithography imaging device. The actual input value is assigned to a first location of the microlithography optical imaging device. The method includes: a) detecting, at a second location of the microlithography optical imaging device, an actual detection value of a detection variable of a detection device of the microlithography optical imaging device; b) using a second relation to computationally ascertain an actual computational value of the detection variable at the second location; c) comparing the actual computational value of the detection variable with the actual detection value of the detection variable to provide a result; and d) based on the result in c), using a relationship between a first predefinable relation and the second relation to correct the predefinable first relation.

9 Claims, 3 Drawing Sheets

Related U.S. Application Data

(60) Provisional application No. 61/770,400, filed on Feb. 28, 2013.

(51) Int. Cl.
 *G03F 7/20* (2006.01)
 *G02B 7/00* (2006.01)
 *G02B 7/02* (2006.01)

(58) Field of Classification Search
 USPC .......................................... 355/30, 53, 67, 77
 See application file for complete search history.

(56) References Cited

FOREIGN PATENT DOCUMENTS

| | | |
|---|---|---|
| EP | 2 136 250 A1 | 12/2009 |
| WO | WO 2007/128835 | 11/2007 |
| WO | WO 2009/039883 | 4/2009 |
| WO | WO 2012/013751 A1 | 2/2012 |

OTHER PUBLICATIONS

International Search Report for corresponding PCT Appl No. PCT/EP2014/053955, dated May 15, 2014.
Written Opinion for corresponding PCT Appl No. PCT/EP2014/053955, dated May 15, 2014.

\* cited by examiner

MODEL-BASED CONTROL OF AN OPTICAL IMAGING DEVICE

CROSS-REFERENCE TO RELATED APPLICATIONS

The present application is a continuation of, and claims benefit under 35 USC 120 to, international application PCT/EP2014/053955, Feb. 28, 2014, which claims benefit under 35 USC 119 of German Application No. 10 2013 203 338.9, filed Feb. 28, 2013 and under 35 USC 119(e) of U.S. Ser. No. 61/770,400, filed Feb. 28, 2013. The entire disclosure of international application PCT/EP2014/053657 is incorporated by reference herein.

BACKGROUND OF THE INVENTION

The actual invention relates to a method for determining an actual input value of an input variable for a control unit of an optical imaging device and to a method for driving an active component of the imaging device as a function of the actual input value. The invention can be used in connection with the microlithography used in the production of microelectronic circuits. It furthermore relates to an optical imaging method which can be carried out, inter alia, via an optical imaging device according to the invention.

Particularly in the field of microlithography, besides using components embodied with the highest possible precision, it is necessary, inter alia, to keep the position and geometry of the components of the imaging device, that is to say for example the optical elements such as lens elements, mirrors or gratings, as far as possible unchanged during operation, in order to achieve a correspondingly high imaging quality. The high accuracy requirements, which are in the microscopic range of the order of magnitude of a few nanometers or less, are in this case not least a consequence of the constant need to increase the resolution of the optical systems used in the production of microelectronic circuits, in order to advance the miniaturization of the microelectronic circuits to be produced.

In order to achieve an increased resolution, either the wavelength of the light used can be reduced, as is the case for systems which operate in the extreme UV range (EUV) with operating wavelengths in the range of 13 nm, or the numerical aperture of the projection system can be increased. One possibility for appreciably increasing the numerical aperture above the value of one is realized via so-called immersion systems, wherein an immersion medium having a refractive index of greater than one is situated between the last optical element of the projection system and the substrate that is intended to be exposed. A further increase in the numerical aperture is possible with optical elements having a particularly high refractive index.

Both with the reduction of the operating wavelength and with the increase in the numerical aperture, there is an increase not just in the requirements made regarding the positioning accuracy and dimensional stability of the optical elements used throughout the course of operation. There is also an increase, of course, in the requirements with regard to minimizing the imaging errors of the entire optical arrangement.

What is of particular importance in this case, is, of course, the temperature distribution within the components used, in particular within the optical elements, and the possibly resultant deformation of the relevant components, for example of an optical element, and a possible temperature-dictated variation of the refractive index of the relevant optical element.

For an EUV system, it is known from EP 1 477 853 A2 (Sakamoto; the disclosure of which is incorporated herein by reference) to actively counteract the heating of a mirror exclusively usable in such systems, the heating resulting from the incident light, and to actively keep a temperature detected at a specific location in the mirror within specific predefined limits. This is done via a temperature adjustment device which is arranged centrally on the rear side of the mirror and which comprises Peltier elements or the like. This solution has the disadvantage firstly that it is not suitable for use with refractive optical elements, such as are used in particular in the case of the immersion systems mentioned, since the central temperature adjustment device would cover the optically used region. Secondly, only the temperature of a single location in the mirror is reliably controlled taking account of the light energy absorbed by the mirror in a more or less stationary state. Further thermal environmental influences, in particular non-stationary and/or locally varying thermal influences, such as can be introduced by an immersion medium and which can cause dynamic or local fluctuations in the temperature distribution in the mirror, are disregarded.

Proceeding from these problems, WO 2007/128835 A1 (Gellrich et al.; the disclosure of which is incorporated by reference herein) proposes, inter alia, using thermal models of the relevant optical elements. In this regard, by way of example, via such a thermal model of an optical element, depending on the actual values of a wide variety of influencing variables (such as, for example, the light power actually used, etc.) and/or detection variables (such as, for example, temperatures measured at specific points in the region of the optical element), it is possible to estimate the actual temperature distribution in the optical element. The insights thus gained regarding the temperature distribution in the optical element can then be used as input variables for a control of the imaging device, which drives active components (for example heating elements and/or cooling elements) as a function of the input variables, in order to achieve a desired temperature distribution in the relevant optical element.

What is problematic here is that, firstly, specific influencing variables that influence the temperature distribution, such as, for example, the actual local light power, can be specified only with limited accuracy, while thermal disturbances often cannot be detected at all. This can have the effect that the estimation of the temperature distribution obtained via the model and the actual temperature distribution in the optical element deviate from one another to a greater or lesser extent, and possibly even drift further and further apart over time, with the result that it is no longer possible to control the temperature distribution as required.

This circumstance could eventually be counteracted via a corresponding refinement of the model, in particular taking into account further influencing variables and/or a larger number of detection points (at which detection variables, such as the temperature, for example, are ascertained). In this case, however, firstly the complexity for creating the thermal model would increase considerably. Furthermore, the calculation effort for ascertaining the input variables of the control and thus the expenditure of time for the driving of the active components would also increase as a result, such that the high dynamic range of the control, especially required in the field of microlithography, may possibly no longer be guaranteed.

BRIEF SUMMARY OF THE INVENTION

Therefore, the present invention is based on the object of providing a method for determining an actual input value of an input variable for a control unit of an optical imaging device, a method for driving an active component of the imaging device, an optical imaging method and an optical imaging device which do not have the abovementioned disadvantages, or have them at least to a lesser extent, and, in particular, in a simple manner enable control of active components of the imaging device to be as precise and dynamic as possible.

The present invention is based on the insight that a precise and dynamic control of an active component of the imaging device using a known first relation between an input variable (assigned to a first location of the imaging device) for the control and predefined reference variables and also using a detected (at a second location of the imaging device) actual value of a detection variable, is made possible if the actually detected value of the detection variable is used firstly to check the actual accuracy of the first relation and, if appropriate, to correct the first relation. Afterward, the input variable for the control can then be determined precisely on the basis of the possibly corrected first relation. In this way, in other words, the known relation which is used for determining the input variable and which takes account of the dynamic behavior of the system can be matched to the real conditions in the imaging device in order to enable the input variable to be determined as realistically as possible.

According to the invention, the actual accuracy of the first relation can be assessed simply by virtue of the fact that on the basis of a known second relation (which is in a known relationship with the first relation) as a function of the actual value of one or more influencing variables, firstly, an actual computational value of the detection variable at the second location is ascertained computationally (at which second location the actual detection value of the detection variable is detected via a corresponding detection device). If a deviation between this computational value (ascertained on the basis of the second relation) and the value of the detection variable actually detected (via the detection device) exceeds a predefinable threshold, a corresponding correction of the first relation can then be performed (owing to the known relationship between the first and second relations).

For this correction, it may suffice, in principle, to derive a corresponding correction of the first relation directly from the ascertained deviation on the basis of suitable assessment criteria. By this approach a particularly rapid adaptation to the real conditions can be achieved.

Preferably, an iterative procedure is chosen for the correction, wherein, firstly, a corresponding correction of the second relation is derived from the ascertained deviation and/or the temporal course of the ascertained deviation on the basis of suitable assessment criteria. The corrected second relation is then used to calculate anew the computational value of the detection variable at the second location and to compare it with the actually detected value of the detection variable. This iteration is continued until the deviation between the computational value (ascertained on the basis of the respectively corrected second relation) and the actually detected value of the detection variable falls below a predefinable threshold. Afterward, a corresponding correction of the first relation can then be performed owing to the known relationship between the first and second relations.

One or a plurality of assessment criteria can be used for the assessment of the deviation and the resultant correction of the respective relation. In principle, any suitable assessment criteria can be involved in this case. In this regard, temporal assessment criteria can be used, for example, which take into account the temporal development of at least one of the variables which influence the relevant relation. This can involve the detection variable and additionally or alternatively also other influencing variables which influence the relation. It is likewise possible to take account of the temporal development of the relation itself, as it results, for example, from one or more preceding corrections.

Likewise, additionally or alternatively, spatial assessment criteria can be used for the assessment of the deviation. In this regard, by way of example, it is possible (for a specific point in time) to ascertain the deviations between the computational value and the actually detected value of the detection variable for a plurality of different second locations. On the basis of these deviations, a corresponding correction of the respective relation can then be ascertained and performed.

In this case, moreover, it goes without saying that, if appropriate, it is also possible to perform a dynamic adaptation of the threshold, upon compliance with which the correction process is concluded. For the adaptation of this threshold, too, it is once again possible to use any desired temporal and/or spatial criteria.

The first relation and the second relation can each be, in principle, of any suitable type. In this regard, by way of example, the first relation may reflect the dependence of the input variable on at least the value of the detection variable at the second location (of the detection device). Likewise, additionally or alternatively, via the first relation, it is also possible to take into account other influencing variables and/or the temporal course thereof. Also with the second relation arbitrary influencing variables and/or the temporal course thereof can be taken into account.

The relationship between the first relation and the second relation can be of any desired type, in principle. In this regard, the first relation can result, for example, at least from parts of the second relation. In variants of the invention that are configured in a particularly simple manner, the first relation and the second relation are in each case part of a mathematical model which was created beforehand for a part of the imaging device, for example a component (such as e.g. an optical element) of the imaging device. Here, the first and second relations correspond to one another in terms of specific constituents (the relationship between the first and second relations resulting therefrom). In this case, it can be provided that, after successful correction of the second relation, only the corresponding constituents of the corrected second relation have to be taken over into the first relation in order to produce the corrected first relation.

This can be realized in a particularly simple manner if the mathematical model is a parameterized model in which the relationship between the first and second relations is provided via at least one model parameter, which, after the second relation has been corrected, then merely has to be taken over into the first relation in order to bring about the correction thereof as well.

In the case of such a parameterized model, the latter can be realized by a set of parameterized differential equations, for example, wherein, for each influencing variable to be taken into account, a transfer function with respect to the input variable to be ascertained can be represented by such a parameterized differential equation.

It should be noted in this context that, if appropriate, it can also be provided that the value of the detection variable that is detected at the second location via the detection device does not directly influence the first relation, but rather is used only in connection with the assessment and correction of the second relation, from which the subsequent correction of the first relation then results. Consequently, it may thus be the case that the direct calculation of the input variable that is effected after the correction of the first relation is effected without using the actual value of the detection variable.

The invention can be used, in principle, in connection with arbitrary detection variables. In this regard, by way of example, a deformation of a component of the imaging device can be detected via a corresponding detection variable which reproduces a change in the spatial relationship between two reference points on the component (as is the case, for example, for the measurement voltage of a strain gauge). It is likewise possible to use a detection variable which is representative of the position and/or orientation of a reference point on the relevant component.

Preferably, the invention is used in connection with detection variables which are representative of a temperature at the second location of the relevant component. A variable which is representative of a temperature at the first location of the relevant component is then preferably likewise used as input variable for the open-loop or closed-loop control in relation to the first location.

In variants of the invention that are configured in a particularly simple manner, the detection variable is a variable which is representative of a temperature at the second location and which is detected via a corresponding temperature sensor. The first and second relations are then preferably parts of a parameterized thermal model of a part of the imaging device (for example of an optical element), which reproduces the dependence of the local temperature of the modeled part on one or more influencing variables. The position of the location for which the local temperature is ascertained (hence, the position of the location under consideration) in this case constitutes a model variable of the model. In the simplest case, the first and second relations then differ merely in the position of the location under consideration (hence, the value of the model variable), while they correspond to each other for the rest (in particular with regard to the values of the model parameters).

The present invention relates to a method for determining an actual input value of an input variable for a control unit of an imaging device, which is designed in particular for microlithography, the input value being assigned to a first location of the optical imaging device. In the method, in a detection step, at least one actual detection value of a detection variable of at least one detection device of the imaging device is detected at a second location, and, in a determination step, the actual input value of the input variable is determined using the at least one actual detection value and a predefinable first relation. In a first calculation step of the determination step, an actual computational value of the detection variable at the second location of the detection device is ascertained computationally using a second relation. In a comparison step of the determination step, the actual computational value of the detection variable is compared with the actual detection value of the detection variable. In a correction step of the determination step, a correction of the first relation is performed as a function of a result of the comparison step using a relationship between the first relation and the second relation. In a second calculation step of the determination step, the second calculation step succeeding the correction step, the actual input value of the input variable is then calculated using the first relation.

The present invention further relates to a method for determining an actual input value of an input variable for a control unit of an optical imaging device, wherein the actual input value is assigned to a first location in the region of a component of the imaging device, which is designed in particular for microlithography. In the method, in a detection step, at least one actual detection value of a detection variable of at least one detection device of the imaging device is detected at a second location in the region of the component, and, in a determination step, the actual input value of the input variable is determined using the at least one actual detection value and a mathematical model of the component. In this case, in a first calculation step of the determination step, an actual computational value of the detection variable at the second location is ascertained computationally using the model. In a comparison step of the determination step, the actual computational value of the detection variable is compared with the actual detection value of the detection variable. In a correction step of the determination step, a correction of the model is performed as a function of a result of the comparison step. Finally, in a second calculation step of the determination step, the second calculation step succeeding the correction step, the actual input value of the input variable is calculated using the model.

The present invention further relates to a method for controlling at least one active component of an optical imaging device, in particular for microlithography, wherein an actual input value of an input variable for a control unit of the imaging device is determined by a method according to the invention, the input value being assigned to a first component of the imaging device, and the control unit drives at least one active second component of the imaging device as a function of the actual input value, wherein the first calculation step, the comparison step, the correction step and the second calculation step are carried out, in particular, as a function of the occurrence of at least one predefinable temporal or non-temporal event.

The present invention further relates to an optical imaging method, in particular for microlithography, wherein in an optical imaging device, a projection pattern illuminated via optical elements of a first group of optical elements is imaged onto a substrate via optical elements of a second group of optical elements, wherein a control unit of the imaging device, in particular during the imaging of the projection pattern, drives at least one active second component of the imaging device according to a method according to the invention.

Finally, the present invention further relates to an optical imaging device, in particular for microlithography, comprising a mask device for accommodating a mask comprising a projection pattern, a substrate device for accommodating a substrate, an illumination device having a first group of optical elements for illuminating the projection pattern, a projection device having a second group of optical elements for imaging the projection pattern on the substrate, an active component, and a control unit. The control unit is configured to determine an actual input value of an input variable for the control unit using a method according to the invention, the input value being assigned to a first component of the imaging device. The control unit is, moreover, configured to drive at least one active second component of the imaging device as a function of the actual input value.

Further preferred configurations of the invention become apparent from the dependent claims and the following description of preferred exemplary embodiments, which refers to the accompanying drawings. It is to be noted that any combination of the features disclosed herein, whether recited in the dependent claims or not, is within the scope of the invention.

DETAILED DESCRIPTION OF THE INVENTION

A preferred embodiment of the optical imaging device for microlithography according to the invention is described below with reference to FIGS. 1 to 3.

Figure 1:
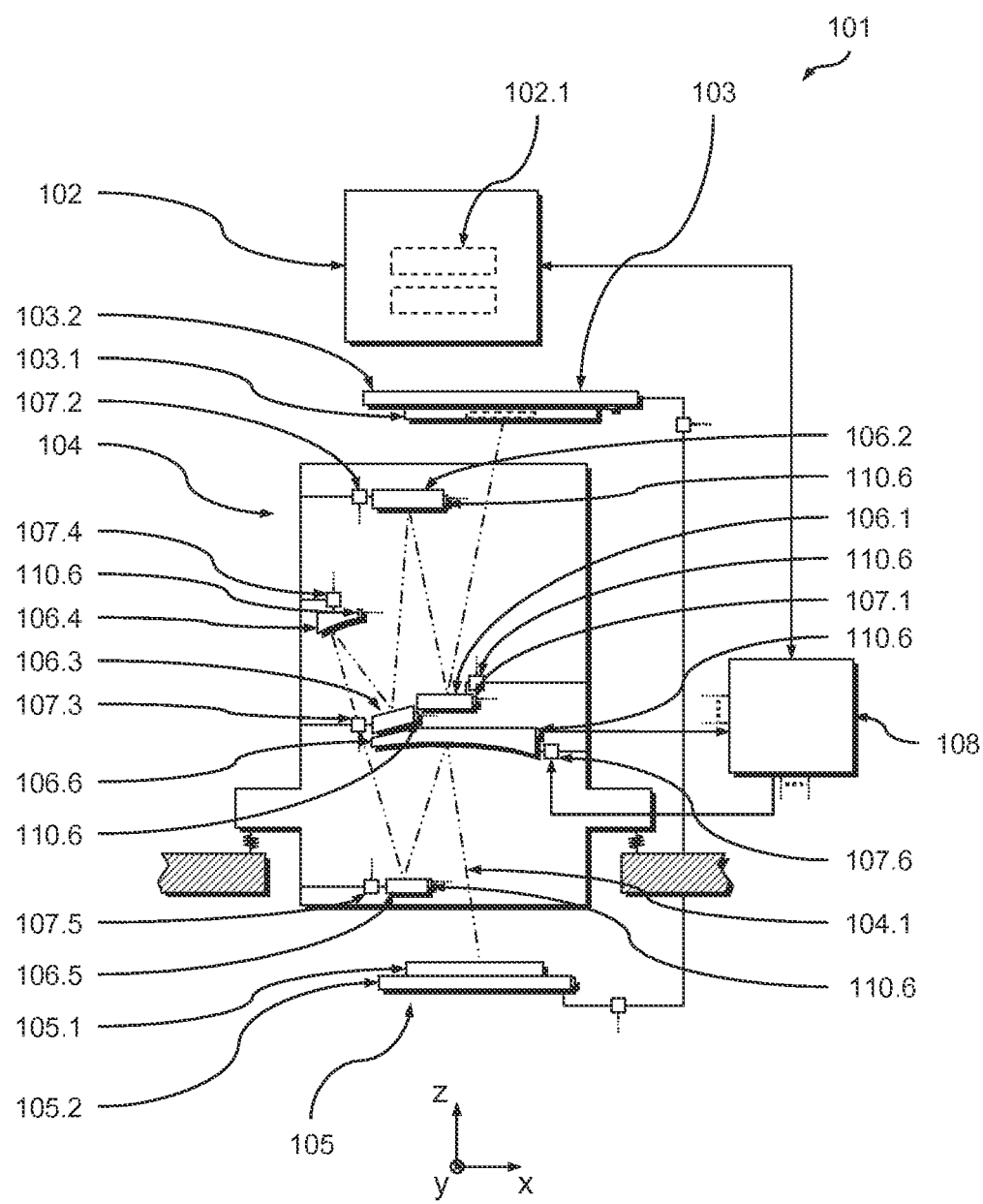
FIG. 1 is a schematic illustration of a preferred embodiment of the optical imaging device according to the invention with which preferred embodiments of the methods according to the invention can be carried out.

FIG. 1 shows a highly schematic illustration of a preferred embodiment of the optical imaging device according to the invention in the form of a microlithography device 101. The microlithography device 101 operates with light in the EUV range, i.e. having a wavelength of approximately 5 nm to 20 nm, in the present example approximately 13 nm. It goes without saying, however, that the invention can also be used in connection with any other operating wavelengths (in particular below 300 nm, for example 193 nm), such as are typically used in the field of microlithography.

The microlithography device 101 comprises an illumination system 102, a mask device 103, an optical projection system in the form of an objective 104, and a substrate device 105. The illumination system 102 illuminates, via a light source (not illustrated) and a first group 102.1 of optical elements (illustrated schematically), a mask 103.1, which is arranged on a mask stage 103.2 of the mask device 103 with a projection light beam (indicated schematically) having the wavelength of 13 nm. A projection pattern is situated on the mask 103.1, which projection pattern is projected with a projection light beam 104.1 (illustrated in a simplified manner), via a second group 106 of optical elements arranged in the objective 104, onto a substrate in the form of a wafer 105.1 arranged on a wafer stage 105.2 of the substrate device 105.

The objective 104 comprises a second group 106 of optical elements, which is formed by a series of first components in the form of optical elements 106.1 to 106.6. The optical elements 106.1 to 106.6 are held in the housing of the objective 104. Owing to the operating wavelength of 13 nm, the optical elements 106.1 to 106.6 are reflective optical elements, that is to say mirrors or the like.

Not least due to the short operating wavelengths, it is necessary to keep the actual temperature distribution TE within the optical elements 106.1 to 106.6, primarily in the region of the respective optical surface of the optical elements 106.1 to 106.6, during operating (in particular during the imaging of the projection pattern onto the wafer 105.1), within very narrow variation limits around a predefined desired temperature distribution TSE. Otherwise, undesirable deformations of the optical surfaces would result from variations of the temperature distribution and would increase the imaging errors, that is to say would therefore lead to a low imaging quality.

The temperature distribution TE in the respective optical element 106.1 to 106.6 is crucially influenced by the temporal course of the light power of the projection light beam 104.1 and also the position, form and power distribution over the area of incidence of the projection light beam 104.1 on the respective optical surface.

In order to comply with the narrow variation limits around a predefined desired temperature distribution TSE, according to the invention an active second component 107.1 to 107.6 is provided for each optical element 106.1 to 106.6, the active second component in each case comprising a temperature adjustment device 107.7. The temperature adjustment device 107.7 of each active second component 107.1 to 107.6 is configured to actively affect the temperature distribution in the assigned optical element 106.1 to 106.6 by actively heating and/or cooling the optical element at least one location, but typically a plurality of (suitably distributed) locations. The temperature adjustment device 107.7 makes it possible, in particular, to achieve a predefined desired temperature distribution TSE at predefined first locations of the respective optical element 106.1 to 106.6, for example at different points of the optical surface of the respective optical element 106.1 to 106.6, the different points of the optical surface being essential for the imaging quality.

For this purpose, during the imaging of the projection pattern onto the wafer 105.1, the respective active second component 107.1 to 107.6 is driven by a control device 108 using a preferred embodiment of the control method according to the invention. Here, according to a preferred embodiment of the method for determining, according to the invention, such an input variable for different first locations on the respective optical surface of the associated optical element 106.1 to 106.6, a variable is determined as input variable for a control unit 108.1 of the control device 108, which is representative of the actual temperature at this first location of the optical surface, as will be described in greater detail below with reference to FIGS. 2 and 3.

In the present example, a maximum deviation ΔTE=1 mK from a predefined desired temperature distribution TSE for the optical surfaces of the optical elements 106.1 to 106.6 is complied with owing to the active temperature control by the active second components 107.1 to 107.6 during the operation of the microlithography device 101. By this approach, the imaging errors or imaging error variations resulting from a thermally induced deformation can be kept sufficiently small in order to achieve a high imaging quality. It goes without saying, however, that, in other variants of the invention, in particular depending on the thermal deformation behavior of the material used, other, if appropriate higher, maximum deviations are also possible. However, the deviations are preferably at most 10 mK, since particularly high imaging qualities can be achieved therewith.

It likewise goes without saying that, in specific variants of the invention, depending on the thermal sensitivity of the individual components, it may also suffice to provide only individual optical elements, if appropriate even only a single one of the optical elements, with such active temperature control. Furthermore, it goes without saying that not just the optical elements of the projection device 104 can be provided with such an active temperature control. Likewise, one or more of the optical elements of the first group 102.1 of optical elements can also be provided with such an active temperature control.

Finally, it goes without saying that such an active temperature control can be provided not only for optical elements but also for other components of the imaging device 101 which can have a negative influence on the imaging quality as a result of thermally induced deformation.

It goes without saying in this context that the predefined desired temperature distribution TSE can be chosen arbitrarily. In this regard, it can be chosen such that the optical elements 106.1 to 106.6, even in the case of this desired temperature distribution TSE, have a minimized imaging error at least for one type of imaging error. Likewise, however, it can also be chosen such that one of the optical elements 106.1 to 106.6, even in the case of this desired temperature distribution TSE, has, at least for one type of imaging error, an imaging error having a magnitude that suffices to reduce or even completely compensate for a corresponding imaging error of the other optical elements 106.1 to 106.6 of the second group 106 of optical elements, such that the total imaging error of the objective 104 is minimized at least for one type of imaging error. Such a minimization of the total imaging error is known from EP 0 956 871 A1 (Rupp; the disclosure of which is incorporated herein by reference).

In this context, it furthermore goes without saying that, in other variants of the invention, in addition or as an alternative to the active temperature control, it is also possible to provide other active influencing of one or more first components, in particular one or more optical elements, of the imaging device 101 via an assigned active second component. In this regard, one or more of the active second components 107.1 to 107.6 can be designed, for example, to mechanically influence the associated first component, hence, the associated optical element 106.1 to 106.6, for example to influence the position and/or orientation thereof in one or more degrees of freedom (up to and including all six degrees of freedom) and/or to alter its geometry in a targeted manner via a local and/or global deformation, in order for example to counteract thermally induced deformations and thus a deterioration of the imaging quality.

Provision can likewise be made for a deterioration of the imaging quality that is caused by a first component, for example the optical element 106.1, to be counteracted by actively influencing one or more of the other first components (which in this case then constitute a third component within the meaning of the present invention), that is to say for example influencing the optical elements 106.2 to 106.6, by an associated active second component 107.2 to 107.6.

The basic configuration and sequence of the control of the active second components 107.1 to 107.6 by the control device 108 is described below by way of example on the basis of the active second component 107.6 assigned to the optical element 106.6 (as first component within the meaning of the present invention). However, the same also applies expressly to the other optical elements 106.1 to 106.5 and the active second components 107.1 to 107.5 assigned thereto.

The control comprises a thermal control loop 109 comprising a temperature adjustment device 107.7 of the active second components 107.6, a detection device 110.6 and the control device 108. The temperature adjustment device 107.6 comprises a series of temperature adjustment elements, for example in the form of Peltier elements, which are arranged in a manner distributed over the optical element 106.6 according to the thermal loading impinging on the optical element 106.6 during operation and according to the desired temperature distribution TSE to be achieved.

The detection device 110.6 comprises a series of temperature sensors arranged in a manner distributed over the optical element 106.6 at second locations of the optical element 106.6. Each temperature sensor detects as detection variable a variable that is representative of the temperature TS at the relevant second location.

Here, it is generally not possible to position the temperature sensors directly on the optical surface of the optical element 106.6. Rather, a specific distance typically has to be maintained in order to avoid a disturbance of the optical surface by the temperature sensor. Consequently, the respective first location on the optical surface of the optical element 106.6, which is crucial for the active temperature control, lies at a specific distance from the second location of a temperature sensor of the detection device 110.6.

On account of this distance between the respective first and second locations, deviations arise in the actual temperature of these two locations, such that the actual measured value TS of the respective temperature sensor at the second location does not directly correspond to the actual real value of the temperature TE at the relevant first location and therefore cannot be used as an input variable for a control module 108.1 of the control device 108, the control module driving the temperature adjustment device 107.7.

In order to take account of this circumstance, a computational estimation TRE of the temperature at the first locations on the optical surface of the optical element 106.6 is performed in the control device 108 via a thermal model 111 of the imaging device 101, the respective result of which estimation is then used as a respective input variable for the control module 108.1. The control module 108.1 then drives the temperature adjustment device 107.7 and, if appropriate, further active components which influence the thermal load on the optical element 106.6, such as the illumination device 102, for example, in a corresponding manner in order to keep the deviation ΔTE from the desired temperature distribution TSE within the limits described above.

Here, the thermal model 111 comprises a thermal model 111.1 of the temperature adjustment device, a thermal model 111.2 of the remaining thermal load acting on the optical element 106.6, a thermal model 111.3 of the optical element and a thermal model 111.4 of the respective temperature sensor of the detection device 110.6. The respective thermal model 111.1 to 111.4 represents a relationship between one or more model input variable and one or more model output variables, which relationship is known with sufficient accuracy.

In this regard, the thermal model 111.1 of the temperature adjustment device represents the relationship between the actual output variables of the control module 108.1 for the temperature adjustment device 107.7 and the proportion of the actual thermal load distribution on the optical element 106.6 which is caused by the temperature adjustment device 107.7. In this case, it goes without saying that further influencing variables, such as, for example, actual operating parameters of the temperature adjustment device or the like, can be taken into consideration.

Furthermore, the thermal model 111.2 of the remaining thermal load represents the relationship between the actual output variables of the control module 108.1 for the illumination device 102 and the proportion of the actual thermal load distribution on the optical element 106.6 which is caused by the illumination device 102. In this case, too, it goes without saying that further influencing variables, such as, for example, actual operating parameters of the illumination device 102 or the like, can be taken into consideration. Likewise, further heat sources or heat sinks or thermal disturbances eventually leading to a corresponding change in the thermal load distribution on the optical element 106.6 can be taken into consideration by this approach.

In particular, the temperature distribution of the components and/or (in particular in the case of thermally stabilized components) the average temperature of the components in the surroundings of the optical element 106.6 can be taken into consideration in this case. In particular, the temperature distribution and/or the average temperature of active components, such as, for example, actuators or the like, in the surroundings of the optical element 106.6 (in particular the active components which act directly on the optical element 106.6) are of particular interest in this case. Likewise, the thermal crosstalk from and/or to adjacent (eventually actively temperature-adjusted) components, in particular other optical elements, can be taken into account. The same applies to the heat output of adjacent electronic components, in particular of sensor devices, such as temperature sensors or position sensors, for example.

The thermal model 111.3 of the optical element 106.6 represents (as a first relation within the meaning of the present invention) the relationship between the actual thermal load distribution on the optical element 106.6 cumulated from the models 111.1 and 111.2 and the actual real temperature distribution TE on the optical surface of the optical element 106.6, which results from the impinging cumulated thermal load distribution. In this case, it goes without saying that further influencing variables, such as, for example, actual operating parameters of the optical element 106.6 (itself configured as an active element) or the like, can be taken into account.

The thermal model 111.4 of the detection device 106.6 represents (as a second relation within the meaning of the present invention) the relationship between the actual thermal load distribution on the optical element 106.6 cumulated from the models 111.1 and 111.2 and the actual real temperature TS at the second location of the respective temperature sensor, which results from the impinging cumulated thermal load distribution. In this case, it goes without saying that further influencing variables, such as, for example, actual operating parameters of the optical element 106.6 (itself configured as an active element) or the like, can be taken into account.

The two thermal models 111.3 and 111.4 are both based on a thermal mathematical model which was created beforehand for the entire imaging device 101 or a part of the imaging device 101, for example even only for the optical element 106.6 itself.

In the present case, the thermal models 111.3 and 111.4 are parts of a parameterized model M in the form of a set of k parameterized differential equations, wherein, for each of the k influencing variables $IN_k$ to be taken into account, a transfer function $TF_k$ with respect to the computational estimation TR of the temperature at predefined points of the optical element 106.6 is represented by such a parameterized differential equation, such that, with the j model parameters $p_j$ and the m model variables $v_m$, the following applies:

$$M = \sum_k TF_k(IN_k; p_j; v_m). \quad (1)$$

In the present case, therefore, the two thermal models 111.3 and 111.4, on the one hand, differ in the coordinates of the points for which the computational estimation TR of the temperature is ascertained. In addition, the thermal model 111.4 comprises (ultimately in a position-dependent manner) components which represent or take into account the properties of the detection device 110.6, such as, for example, the arrangement of the detection device 110.6 and/or the temporal response behavior of the detection device 110.6 and/or errors of the detection device 110.6.

The thermal model 111 can be realized in the control device 108 in any suitable manner. In the present example, it is in the form of corresponding data comprising, in particular, one or more executable programs, stored in one or more storage elements of the control device 108, accessed by one or more processors of the control device 108 in order to perform the functions described.

Figure 2:
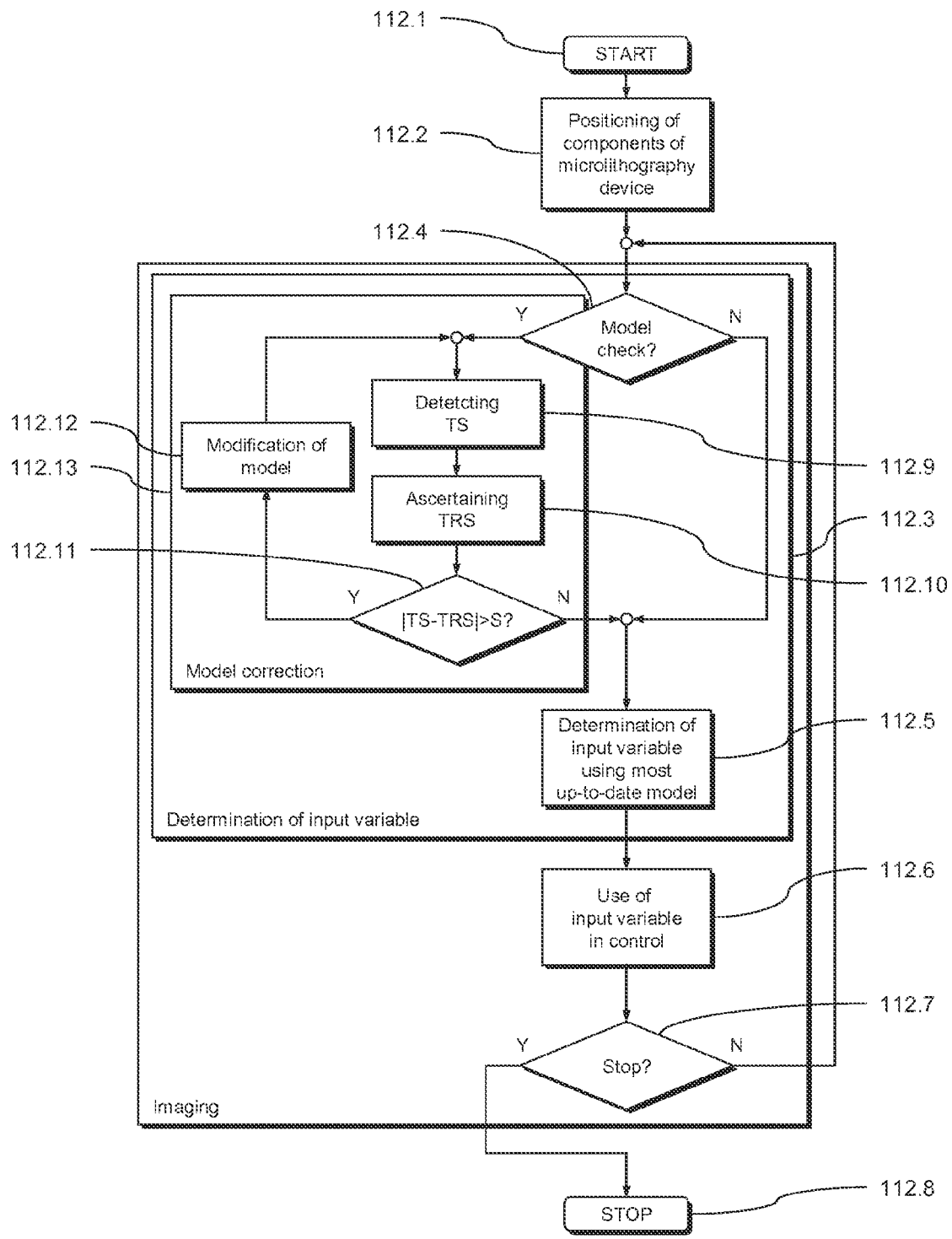
FIG. 2 is a flow chart of a preferred embodiment of an optical imaging method according to the invention which comprises a preferred embodiment of a method according to the invention for controlling an active component of the imaging device from FIG. 1 and a preferred embodiment of a method according to the invention for determining an actual input value of an input variable for a control unit of the imaging device from FIG. 1.

In order to combat the problem that the computational estimation TRE of the actual temperature distribution on the optical surface of the optical element 106.6 (which is used as an input variable for the control module 108.1 for controlling the temperature adjustment device 107.7), owing to thermal disturbances or drift effects, deviates considerably from the actual real temperature distribution TE on the optical surface of the optical element 106.6, in the present example a correction unit 111.5 is provided, in which the thermal model M is corrected, as described in greater detail below in connection with a preferred exemplary embodiment of the imaging method according to the invention, in particular with reference to FIG. 2.

As can be seen from FIG. 2, the method sequence is firstly started in a step 112.1, while in a subsequent step 112.2 the components of the microlithography device 101 are positioned and oriented, thus resulting in the above-described configuration in which the projection pattern can be imaged on the wafer 105.1 in a subsequent imaging step.

In parallel with the optical imaging of the projection pattern on the wafer 105.1, in a determination step 112.3, using the model M, the value of a variable is ascertained for predefined first locations at the optical surface of the optical element 106.6, which is representative of the actual computational temperature TRE at the optical surface. This value is forwarded in each case as the actual input value of an input variable to the control module 108.1 and used by the latter for driving the temperature adjustment device 107.7 and, eventually, also the illumination device 102.

In a step 112.4, a check is firstly made here to determine whether an event has occurred which necessitates checking the thermal model M. This can be an arbitrary event. In this regard, by way of example, non-temporal events, such as switching on the illumination device 102, starting the imaging process, reaching a predefined number of exposure steps, reaching specific temperatures at specific points of the imaging device 101, etc., can be predefined, upon the occurrence of which the thermal model M is checked. Likewise, of course, arbitrary temporal events, for example the elapsing of a predefined time interval, can initiate the checking of the thermal model M. Furthermore, it goes without saying that continuous checking of the thermal model M is provided at least in specific operating states of the imaging device 101. Finally, it goes without saying that arbitrary logical combinations of a plurality of such temporal and/or non-temporal events can be predefined.

If it is established in step 112.4 that no checking of the thermal model M is to be carried out, in a calculation step 112.5, an actual input value of the input variable for the control module 108.1 representative of the actual computational temperature TRE on the optical surface is calculated for the predefined points on the optical surface using the model M currently stored in the control device 108. Herein, the thermal models 111.1, 111.2 and 111.3 are used in the manner described above.

The value ascertained in this way is respectively forwarded, as the actual input value of an input variable, to the control module 108.1 and used by the latter in a driving step 112.6 for driving the temperature adjustment device 107.7 and, if appropriate, also the illumination device 102.

In a step 112.7, a check is then made to determine whether the method sequence should be ended. If this is the case, the method sequence ends in a step 112.8. Otherwise, the method jumps back to step 112.4.

If it is established in step 112.4 that checking of the thermal model M is to be carried out, firstly, in a step 112.9, via the temperature sensors of the detection device 110.6, an actual detection value of a detection variable (for example of a measurement voltage) is ascertained at the respective second location of the temperature sensor, the detection variable being representative of the actual temperature TS at the second location.

Furthermore, in a (first) calculation step 112.10, via the thermal model 111.4 of the respective temperature sensor actually stored in the control device 108 and using the model M, an actual computational value of the temperature TRS for the position of the temperature sensor is calculated. In this case, the thermal models 111.1, 111.2 and 111.4 are used in the manner described above.

It goes without saying that steps 112.9 and 112.10 can, of course, also be carried out in the opposite order or at least section-wise in parallel.

In a comparison step 112.11, for the respective temperature sensor a check is then made to determine whether the absolute value of the difference between the actually detected temperature TS and the computational value of the temperature TRS exceeds a predefined threshold value S, i.e. whether the following applies:

$$|TS-TRS|=DT>S. \quad (2)$$

If this is the case for none of the temperature sensors, it is concluded that the actually stored model M corresponds sufficiently well to the real situation as it is detected using the temperature sensors. Consequently, the method jumps to the (second) calculation step 112.5, i.e. the actual input values for the control module 108.1, which are representative of the actual computational temperature TRE on the optical surface, are ascertained using the thermal models 111.1, 111.2 and 111.3 in the manner described above.

If the relationship DT>S applies to one of the temperature sensors, it is concluded that the actually stored model M no longer corresponds sufficiently well to the real situation as it is detected using the temperature sensors. Consequently, a model correction is performed in a step 112.12 in order to match the model M to the real situation.

For this model correction, a corresponding correction of the model M is directly derived from the ascertained deviation DT on the basis of suitable assessment criteria, wherein at least one model parameter $p_j$ is correspondingly altered in order to correct the model M.

For the assessment of the deviation DT and the resultant correction of the model parameters $p_j$, in particular for the decision as to which of the model parameters $p_j$ are altered and the extent to which this takes place, one or more assessment criteria are stored in the correction module 111.5 of the control device 108. Any suitable assessment criteria can be involved here, in principle. In this regard, by way of example, it is possible to use historical or temporal assessment criteria which take into account the temporal development of at least one of the influencing variables which find their entry into the model M.

This can involve, for example, the temporal development of the detection variable detected via the detection device 110.6, hence, in the present example, the temperature detected via the temperature sensors. Additionally or alternatively, it is also possible to take into account other influencing variables that are taken into account in the model M. Likewise, the temporal development of the model M itself as it arises, for example, from one or more preceding corrections, can influence the assessment and the resultant modification of the model M.

Additionally or alternatively, spatial assessment criteria can also be used for the assessment of the deviation DT. In this regard, by way of example, the deviations DT (existing at a specific point in time) for a plurality of temperature sensors, that is to say therefore the spatial deviation of the modeled temperature distribution from the actual temperature distribution, can suitably influence the assessment and conclusions regarding the required correction of the model M can be drawn on the basis of this spatial distribution of the deviations DT.

This can involve local spatial assessment criteria which, for example, take into account only the relation of the respective deviation DT to the deviations DT of the directly adjacent temperature sensors. Likewise, however, it is also possible, of course, to apply global assessment criteria taking into account the deviations DT for all of the temperature sensors.

Moreover, it goes without saying that, if appropriate, it is also possible to perform a dynamic adaptation of the threshold S, upon compliance with which the correction process is concluded. For the adaptation of this threshold, too, it is once again possible to use any desired temporal and/or spatial criteria. Furthermore, additionally or alternatively, it is possible to provide a spatial distribution for the threshold S, that is to say that different threshold values S can be provided for different temperature sensors.

In principle, in the case of variants with a rapid adaptation, a single correction of the model M or modification of the relevant model parameters $p_j$ may suffice to establish the match between the model M and the real situation. In such a case, after step 112.12, the method would then jump directly to step 112.5, wherein the correspondingly modified model parameters pi of the model 111.4 are then simply inserted into the model 111.3 in order to determine the input variables (representative of the computational temperature distribution TRE) for the control module 108.1.

Preferably, however, an iterative procedure is chosen for the correction, in which procedure in an iteration step 112.13 after the modification in step 112.12 the method jumps again to step 112.9 and the subsequent step 112.10 is carried out with the last modified model M before the comparison step 112.11 is repeated.

If it emerges in the repeated comparison step 112.11 that the relationship DT>S no longer applies to any of the temperature sensors, it is concluded that the actually stored, modified model M was matched sufficiently well to the real situation such as is detected using the temperature sensors. Consequently, the method jumps to the (second) calculation step 112.5, i.e. the actual input values for the control module 108.1, which are representative of the actual computational temperature TRE on the optical surface, are calculated in the manner described above using the thermal models 111.1, 111.2 and 111.3.

If, even with the modified model M, the relationship DT>S applies to one of the temperature sensors, it is concluded that even the modified model M does not yet correspond sufficiently well to the real situation such as is detected using the temperature sensors. Consequently, the iteration step 112.13 is repeated starting with step 112.12, in order to perform a further model correction.

This iteration can be repeated until a sufficient approximation of the model M to the real situation is reached. In the comparison step 112.11 it is also possible, however, to check one or more termination criteria, the fulfillment of which then leads to termination of the iteration and continuation of the method with step 112.5. This can be advantageous particularly in the case of momentarily unstable states.

It should be mentioned at this point that the temperature TS detected via the temperature sensors of the detection device 110.6, in the present example, need not necessarily directly influence the model M and thus the calculation of the input variables for the control module 108.1. Rather, it may suffice for these temperatures TS to be used, as described, only in connection with the assessment and correction of the model M.

It goes without saying, however, that other variants of the invention can also provide for these temperatures to directly influence the determination of the input variables for the control module. By way of example, a relationship, for example in the form of one or more differential equations, between the temperature TS of the respective temperature sensor and the computational temperature TRE on the optical surface of the optical element can be predefined as a first relation. In this case, the temperature TS of the respective temperature sensor can then be used both for correcting this first relation and directly for ascertaining the input variables for the control module.

Figure 3:
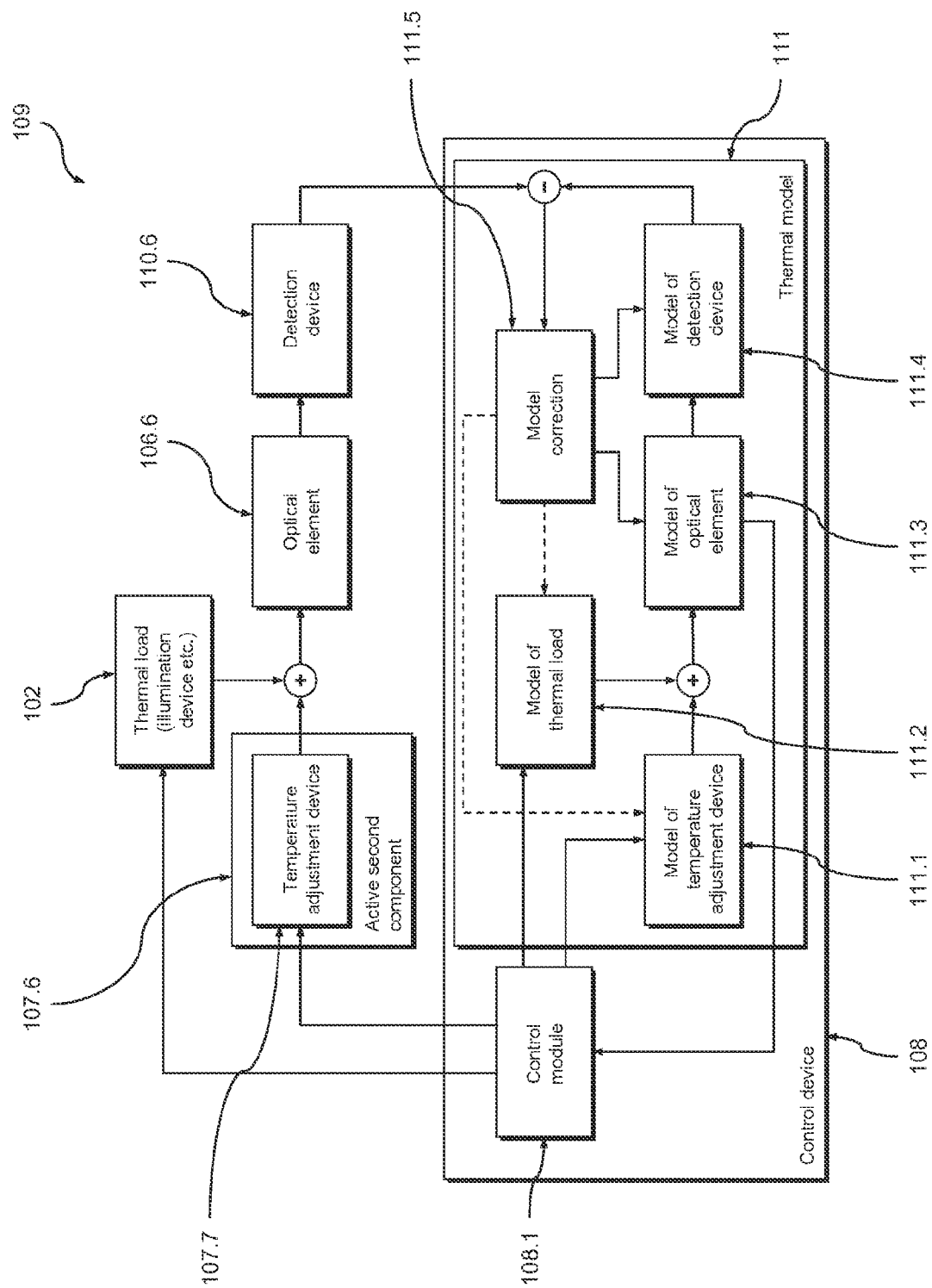
FIG. 3 is a schematic signal flow diagram of a part of the imaging device from FIG. 1.

It should furthermore be mentioned at this point that the model correction 111.5, if appropriate, can also affect the modeling of the temperature adjustment device 111.1 and/or also the modeling of the rest of the thermal load 111.2, as is illustrated by the dashed lines in FIG. 3. This may be the case, in particular, if the model M itself represents a modeling of a majority of the imaging device 101 up to and including the complete modeling of the imaging device 101.

The present invention has been described above on the basis of an example in which an active temperature control is provided for all of the optical elements 106.1 to 106.6 of the second group 106 of optical elements. It should once again be noted at this point, that such an active temperature control, in other variants of the invention, can, of course, be used only for individual optical elements. Likewise, such an active temperature control can additionally or alternatively also be used in connection with one or more of the optical elements of the first group 102.1 of optical elements.

Furthermore, it goes without saying that the active influencing of individual components (or optical elements) can be carried out only as a function of the ascertained temperature distribution of other (for example neighboring) components (or optical elements, respectively). This may be the case, in particular, if a relationship known with sufficient accuracy exists between the ascertained temperature distribution of individual components (or optical elements, respectively) and the temperature distribution of such other components. This may be the case, in particular, if these other components are situated in a thermally correspondingly stable environment.

Furthermore, the present invention has been described above on the basis of an example in which a variable representative of a temperature was used as the detection variable. It should be mentioned again at this point that the invention can, in principle, also be used in connection with any other detection variables. In this regard, by way of example, a deformation of a component of the imaging device can be detected via a corresponding detection variable which reproduces a change in the spatial relationship between two reference points on the components (as is the case for example for the measurement voltage of a strain gauge). It is likewise possible to use a detection variable which is representative of the position and/or orientation of a reference point on the relevant component.

The present invention has been described above on the basis of an example in which the groups 102.1 and 106 of optical elements consist exclusively of reflective optical elements. It should be noted at this point, however, that the invention can be applied, of course, in particular for the case of imaging at other operating wavelengths, also to groups of optical elements which comprise refractive, reflective or diffractive optical elements solely or in arbitrary combination.

The invention claimed is:

1. A method of determining an actual input value of an input variable for a control unit of a microlithography imaging device, the actual input value being assigned to a first location of the microlithography optical imaging device, the method comprising:
   a) detecting, at a second location of the microlithography optical imaging device, an actual detection value of a detection variable of a detection device of the microlithography optical imaging device;
   b) using a second relation to computationally ascertain an actual computational value of the detection variable at the second location;
   c) comparing the actual computational value of the detection variable with the actual detection value of the detection variable to provide a result;
   d) based on the result in c), using a relationship between a first predefinable relation and the second relation to correct the predefinable first relation; and
   e) after d), using the corrected first predefinable relation to calculate the actual input value of the input variable, further comprising:
      i) correcting the second relation based on at least the result in c) to provide a corrected second relation;
      ii) using the corrected second relation to repeat b);
      iii) after ii), repeating c) to provide a second result; and
      iv) repeating i), ii) and iii) when, based on the second result, a predefinable deviation between the actual computational value of the detection variable and the actual detection value of the detection variable is exceeded.

2. A method of determining an actual input value of an input variable for a control unit of a microlithography imaging device, the actual input value being assigned to a first location of the microlithography optical imaging device, the method comprising:
   a) detecting, at a second location of the microlithography optical imaging device, an actual detection value of a detection variable of a detection device of the microlithography optical imaging device;
   b) using a second relation to computationally ascertain an actual computational value of the detection variable at the second location;
   c) comparing the actual computational value of the detection variable with the actual detection value of the detection variable to provide a result;

d) based on the result in c), using a relationship between a first predefinable relation and the second relation to correct the predefinable first relation; and
e) after d), using the corrected first predefinable relation to calculate the actual input value of the input variable, further comprising:
   i) correcting the second relation based on at least the result in c) to provide a corrected second relation;
   ii) using the corrected second relation to repeat b);
   iii) after ii), repeating c) to provide a second result; and
iv) repeating i), ii) and iii) when, based on the second result, a predefinable deviation between the actual computational value of the detection variable and the actual detection value of the detection variable is exceeded, wherein:
   i) comprises using an optimization algorithm which uses at least one optimization criterion selected from the group consisting of a historical optimization criterion, a local optimization criterion and a global optimization criterion;
   the historical optimization criterion takes into account a result of d);
   the local optimization criterion takes into account the result of c) for a further detection device of the detection variable located adjacent to the detection device; and
   the global optimization criterion takes into account a result of c) for all detection devices of a group of detection devices which comprises a plurality of detection devices of the detection variable which are assigned to an optical element of the microlithography optical imaging device.

3. A method of determining an actual input value of an input variable for a control unit of a microlithography optical imaging device, the actual input value being assigned to a first location in a region of a component of the microlithography optical imaging device, the method comprising:
   a) detecting an actual detection value of a detection variable of a detection device of the microlithography optical imaging device at a second location in a region of the component;
   b) using a mathematical model to computationally ascertain an actual computational value of the detection variable at the second location;
   c) comparing the actual computational value of the detection variable with the actual detection value of the detection variable to provide a result;
   d) based on the result in c), correcting the mathematical model; and
e) using the corrected mathematical model to calculate the actual input value of the input variable, wherein:
   a) based on a result of a most recent preceding comparison, for correcting the model, the model parameter is modified, b) is repeated using the modified at least one model parameter, and c) is subsequently repeated; and
   b) repeating a) when, the actual computational value of the detection variable and the actual detection value of the detection variable is exceeded; and
   the model with the last modified at least one model parameter is used in e) when c) establishes that the predefinable deviation between the actual computational value of the detection variable and the actual detection value of the detection variable is not exceeded.

4. A method of determining an actual input value of an input variable for a control unit of a microlithography imaging device, the actual input value being assigned to a first location of the microlithography optical imaging device, the method comprising:
   a) detecting, at a second location of the microlithography optical imaging device, an actual detection value of a detection variable of a detection device of the microlithography optical imaging device;
   b) using a second relation to computationally ascertain an actual computational value of the detection variable at the second location;
   c) comparing the actual computational value of the detection variable with the actual detection value of the detection variable to provide a result;
   d) based on the result in c), using a relationship between a first predefinable relation and the second relation to correct the predefinable first relation; and
e) after d), using the corrected first predefinable relation to calculate the actual input value of the input variable, wherein:
   the optical imaging device comprises a plurality of optical elements configured to image an object plane into an image plane;
   the plurality of optical elements comprises a first optical element;
   the first location is on the first optical element; and
   the second location is adjacent the first optical element.

5. The method of claim 4, wherein the optical imaging device comprises a housing, and the plurality of optical elements are in an interior of the housing.

6. A method of determining an actual input value of an input variable for a control unit of a microlithography optical imaging device, the actual input value being assigned to a first location in a region of a component of the microlithography optical imaging device, the method comprising:
   a) detecting an actual detection value of a detection variable of a detection device of the microlithography optical imaging device at a second location in a region of the component;
   b) using a mathematical model to computationally ascertain an actual computational value of the detection variable at the second location;
   c) comparing the actual computational value of the detection variable with the actual detection value of the detection variable to provide a result;
   d) based on the result in c), correcting the mathematical model; and
e) using the corrected mathematical model to calculate the actual input value of the input variable, wherein:
   the optical imaging device comprises a plurality of optical elements configured to image an object plane into an image plane;
   the plurality of optical elements comprises a first optical element;
   the first location is on the first optical element; and
   the second location is adjacent the first optical element.

7. The method of claim 6, wherein the optical imaging device comprises a housing, and the plurality of optical elements are in an interior of the housing.

8. A method of determining an actual input value of an input variable for a control unit of a microlithography imaging device, the actual input value being assigned to a first location of the microlithography optical imaging device, the method comprising:
   a) detecting, at a second location of the microlithography optical imaging device, an actual detection value of a detection variable of a detection device of the microlithography optical imaging device;

b) using a second relation to computationally ascertain an actual computational value of the detection variable at the second location;
c) comparing the actual computational value of the detection variable with the actual detection value of the detection variable to provide a result;
d) based on the result in c), using a relationship between a first predefinable relation and the second relation to correct the predefinable first relation; and
e) after d), using the corrected first predefinable relation to calculate the actual input value of the input variable, wherein the first predefinable relation and/or the second relation is a part of a mathematical model of an optical element of the microlithography optical imaging device.

9. A method of determining an actual input value of an input variable for a control unit of a microlithography optical imaging device, the actual input value being assigned to a first location in a region of a component of the microlithography optical imaging device, the method comprising:

a) detecting an actual detection value of a detection variable of a detection device of the microlithography optical imaging device at a second location in a region of the component;
b) using a mathematical model to computationally ascertain an actual computational value of the detection variable at the second location;
c) comparing the actual computational value of the detection variable with the actual detection value of the detection variable to provide a result;
d) based on the result in c), correcting the mathematical model; and
e) using the corrected mathematical model to calculate the actual input value of the input variable, wherein the first predefinable relation and/or the second relation is a part of a mathematical model of an optical element of the microlithography optical imaging device.

* * * * *

UNITED STATES PATENT AND TRADEMARK OFFICE
CERTIFICATE OF CORRECTION

PATENT NO. : 9,581,912 B2  
APPLICATION NO. : 14/812008  
DATED : February 28, 2017  
INVENTOR(S) : Markus Hauf et al.

Page 1 of 1

It is certified that error appears in the above-identified patent and that said Letters Patent is hereby corrected as shown below:

In the Specification

Column 8, Line 24, after "element", insert -- at --.

Column 14, Line 47, delete "pi" and insert -- $p_j$ --.

Signed and Sealed this  
Fourth Day of July, 2017

Joseph Matal  
*Performing the Functions and Duties of the*  
*Under Secretary of Commerce for Intellectual Property and*  
*Director of the United States Patent and Trademark Office*